United States Patent
Tee et al.

(10) Patent No.: US 9,196,544 B2
(45) Date of Patent: Nov. 24, 2015

(54) INTEGRATED CIRCUITS WITH STRESSED SEMICONDUCTOR-ON-INSULATOR (SOI) BODY CONTACTS AND METHODS FOR FABRICATING THE SAME

(71) Applicant: GLOBALFOUNDRIES Singapore Pte. Ltd., Singapore (SG)

(72) Inventors: Kheng Chok Tee, Singapore (SG); Meijun Lu, Singapore (SG); Kam Chew Leong, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/213,288

(22) Filed: Mar. 14, 2014

(65) Prior Publication Data

US 2015/0262885 A1    Sep. 17, 2015

(51) Int. Cl.
| | |
|---|---|
| *H01L 21/336* | (2006.01) |
| *H01L 21/8238* | (2006.01) |
| *H01L 29/66* | (2006.01) |
| *H01L 29/78* | (2006.01) |

(52) U.S. Cl.
CPC .. *H01L 21/823807* (2013.01); *H01L 29/66477* (2013.01); *H01L 29/7841* (2013.01); *H01L 29/7847* (2013.01)

(58) Field of Classification Search
CPC ............... H01L 21/823807; H01L 29/66477; H01L 29/7847
USPC ........................................................ 438/197
See application file for complete search history.

(56) References Cited

U.S. PATENT DOCUMENTS

| | | | |
|---|---|---|---|
| 6,905,919 | B2 | 6/2005 | Chan et al. |
| 7,550,364 | B2 | 6/2009 | Chidambarrao et al. |
| 8,053,325 | B1 * | 11/2011 | Chou et al. ............ 438/306 |
| 2003/0141543 | A1 * | 7/2003 | Bryant et al. ......... 257/347 |
| 2009/0065867 | A1 * | 3/2009 | Yin et al. ............... 257/351 |

* cited by examiner

*Primary Examiner* — Bradley K Smith
(74) *Attorney, Agent, or Firm* — Ingrassia Fisher & Lorenz, P.C.

(57) ABSTRACT

Integrated circuits with selectively stressed semiconductor-on-insulator (SOI) body contacts and methods for fabricating integrated circuits with selectively stressed SOI body contacts are provided. An exemplary method for fabricating an integrated circuit includes forming a channel region and a body contact overlying and/or in an SOI substrate. Further, the method includes selectively applying a first stress to the source/drain region in a longitudinal direction. Also, the method includes selectively applying a second stress to the body contact in a lateral direction perpendicular to the longitudinal direction.

19 Claims, 4 Drawing Sheets

INTEGRATED CIRCUITS WITH STRESSED SEMICONDUCTOR-ON-INSULATOR (SOI) BODY CONTACTS AND METHODS FOR FABRICATING THE SAME

TECHNICAL FIELD

The present disclosure generally relates to integrated circuits with semiconductor-on-insulator (SOI) body contacts and methods for fabricating integrated circuits with SOI body contacts, and more particularly relates to integrated circuits and methods for fabricating integrated circuits with selectively stressed SOI body contacts.

BACKGROUND

Continued scaling of complementary metal oxide semiconductor (CMOS) technology is reaching physical limits in device performance. For example, parasitic resistances and capacitances are becoming a fundamental limiting factor to improvement of device performance at reduced technology nodes. New materials and device architectures are thus required in order to overcome these fundamental scaling obstacles that degrade device performance.

One approach to overcome these limiting effects is to increase the drive current of the metal-oxide-semiconductor field effect transistor (MOSFET) or MOS transistor device by increasing the mobility of the carriers in the channel. It is well known that the application of mechanical stress on channel regions can substantially improve or degrade the mobility of electrons and holes in a semiconductor; however, it is also known that electrons and holes respond differently to the same type of stress. For example, the application of compressive stress in the longitudinal direction of current flow is beneficial for hole mobility, but detrimental for electron mobility. The application of tensile stress in the longitudinal direction is beneficial for electrons, but detrimental for holes.

State of the art technology has used stressed nitride liners that are deposited after silicidation to apply longitudinal stress to the channel and therefore increase the current drive of CMOS devices. However, it is imperative to develop an integration scheme that allows the desired application of stress (compressive or tensile) on appropriate areas of devices (NMOS transistor devices or PMOS transistor devices) to maximize performance of CMOS technology.

Accordingly, it is desirable to provide integrated circuits with improved performance and methods for fabricating integrated circuits with improved performance through selectively stressing channel regions and selectively stressing body contacts. Also, it is desirable to provide integrated circuits and methods for fabricating integrated circuits with longitudinally stressed channel regions and laterally stressed body contacts. Further, it is desirable to provide integrated circuits and methods for fabricating integrated circuits in which PMOS transistor devices are formed with compressive stress in the longitudinal direction and with tensile stress in the lateral direction. Furthermore, other desirable features and characteristics will become apparent from the subsequent detailed description and the appended claims, taken in conjunction with the accompanying drawings and the foregoing technical field and background.

BRIEF SUMMARY

Integrated circuits with selectively stressed semiconductor-on-insulator (SOI) body contacts and methods for fabricating integrated circuits with selectively stressed SOI body contacts are provided. An exemplary method for fabricating an integrated circuit includes forming a channel region and a body contact overlying and/or in an SOI substrate. Further, the method includes selectively applying a first stress to the source/drain region in a longitudinal direction. Also, the method includes selectively applying a second stress to the body contact in a lateral direction perpendicular to the longitudinal direction.

In another embodiment, a method for fabricating an integrated circuit includes providing a semiconductor substrate. The method includes forming a first transistor device over the semiconductor substrate including a first channel region and a first body contact. Further, the method includes forming a second transistor device over the semiconductor substrate including a second channel region and a second body contact. The method stresses the first channel region, the first body contact, and the second body contact with a first-type stress. Also, the method stresses the second channel region with a second-type stress.

In accordance with another embodiment, an integrated circuit is provided. The integrated circuit includes a semiconductor-on-insulator (SOI) substrate and a PMOS transistor device formed over the SOI substrate. The PMOS transistor device includes a channel region under compressive stress in a longitudinal direction and a body contact under tensile stress in a lateral direction perpendicular to the longitudinal direction.

BRIEF DESCRIPTION OF THE DRAWINGS

Embodiments of integrated circuits and methods for fabricating integrated circuits with selectively stressed SOI body contacts and methods for fabricating integrated circuits with selectively stressed SOI body contacts will hereinafter be described in conjunction with the following drawing figures, wherein like numerals denote like elements, and wherein.

DETAILED DESCRIPTION

Figure 1:
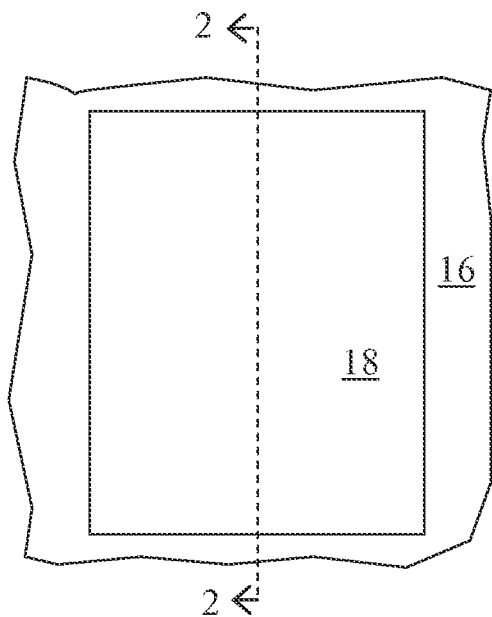
FIG. 1 is an overhead view of a semiconductor-on-insulator (SOI) structure which is utilized by embodiments of integrated circuits and methods of fabricating integrated circuits herein.

The following detailed description is merely exemplary in nature and is not intended to limit the integrated circuits or the methods for fabricating integrated circuits as claimed herein. Furthermore, there is no intention to be bound by any expressed or implied theory presented in the preceding technical field, background or brief summary, or in the following detailed description.

In accordance with the various embodiments herein, integrated circuits with selective stressed body contacts and methods for fabricating integrated circuits with selectively stressed body contacts are provided. Generally, the following embodiments relate to the formation of an integrated circuit including a transistor device which includes a longitudinally stressed channel region and a laterally stressed body contact. An exemplary integrated circuit includes a PMOS transistor device with a channel region under compressive longitudinal stress and a body contact under tensile lateral stress. Further, the exemplary integrated circuit includes an NMOS transistor device with a channel region and a body contact under tensile lateral stress.

In an exemplary embodiment, a tensile stress film, i.e., a film producing a tensile stress in an underlying layer, is formed over an NMOS device area from which a NMOS channel region is formed. The tensile stress film is also formed over an NMOS body contact area and a PMOS body contact area. In the exemplary embodiment, a compressive stress film, i.e., a film producing a compressive stress in an underlying layer, is formed over a PMOS device area from which a PMOS channel region is formed. The exemplary methods described herein add no additional processing steps to the integrated circuit fabrication process. Specifically, the PMOS body contact area is processed in the same manner and with the same processes as the NMOS device area and NMOS body contact area. The PMOS device area may be conventionally stressed.

The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Figure 2:
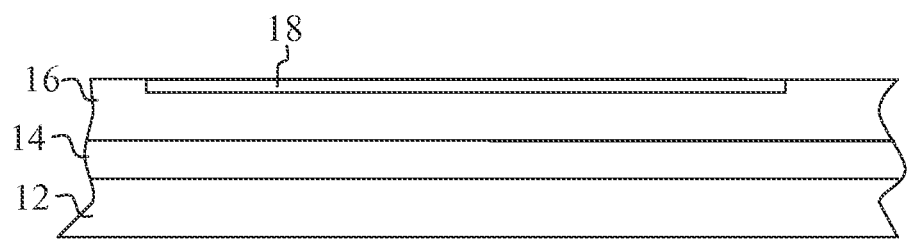
FIG. 2 is a cross-section view of the SOI structure of FIG. 1, taken along line 2-2 in FIG. 1.

FIGS. 1 and 2 illustrate an exemplary silicon-on-insulator (SOI) structure 10 used in embodiments herein. FIG. 1 is a top view of the SOI structure 10 and FIG. 2 is a cross sectional view of the SOI structure taken along line 2-2 in FIG. 1. As shown, the exemplary SOI structure 10 includes a substrate 12 of semiconductor material. The term "semiconductor material" is used herein to denote any semiconductor material, including relatively pure silicon; silicon admixed with other elements such as germanium, carbon, and the like; non-silicon material such as germanium, gallium arsenide, or the like; or admixtures of such non-silicon materials. The "semiconductor material" may be doped or undoped. An exemplary semiconductor substrate 12 is comprised of P type, single crystalline silicon featuring a <100> crystallographic orientation.

A semiconductor on insulator (SOI) layer comprised of an insulator layer 14 and an upper semiconductor layer 16 is formed on the semiconductor substrate 12. As used herein, terms such as "upper" and "lower" describe the orientation and/or location of a feature or element within the consistent but arbitrary frame of reference illustrated by the drawings.

The upper semiconductor layer 16 and insulator layer 14 may be formed on semiconductor substrate 12 via a SIMOX (separation by implanted oxygen) procedure. An exemplary SIMOX procedure features implantation of oxygen ions into semiconductor substrate 12, followed by an anneal procedure resulting in formation of a buried silicon oxide layer as insulator layer 14, at a thickness of from about 1000 to about 3000 Angstroms. Overlying the oxide layer 14 is the non-implanted top portion of semiconductor substrate 12, now defined as upper semiconductor layer 16. An exemplary upper semiconductor layer 16 is formed with a thickness of from about 1000 to about 3000 Angstroms. Alternatively, the SOI structure can be obtained via bonding of a first silicon oxide layer located on a first semiconductor substrate, to a second silicon oxide layer located on a second semiconductor substrate. Removal of semiconductor material from semiconductor substrate to form the thinned semiconductor substrate as the upper semiconductor layer of the SOI configuration may be accomplished via a chemical mechanical polishing (CMP) procedure. Photolithographic and dry etching procedures may be further used to selectively define the desired configuration of the upper semiconductor layer 16 overlying the insulator layer 14. Removal of the photoresist shape used for definition of upper semiconductor layer 16 may be accomplished via plasma oxygen ashing procedures.

As shown in FIGS. 1 and 2, a gate insulator layer 18 is formed over the upper semiconductor layer 16. An exemplary gate insulator layer 18 is silicon dioxide. In an exemplary embodiment, the gate insulator layer 18 is thermally grown. An exemplary gate insulator layer 18 has a thickness of from about 10 to about 100 Angstroms.

Figure 3:
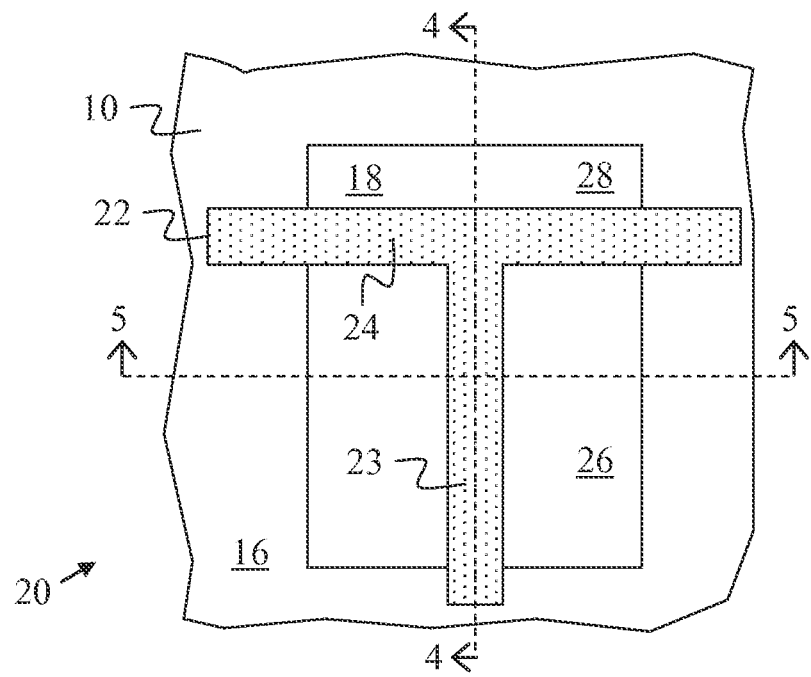
FIG. 3 is an overhead view of a partially fabricated integrated circuit including a gate structure formed on the SOI structure of FIGS. 1 and 2, and illustrating the relationship between a body contact area and an active device area before application of stresses according to embodiments herein.
Figure 4:
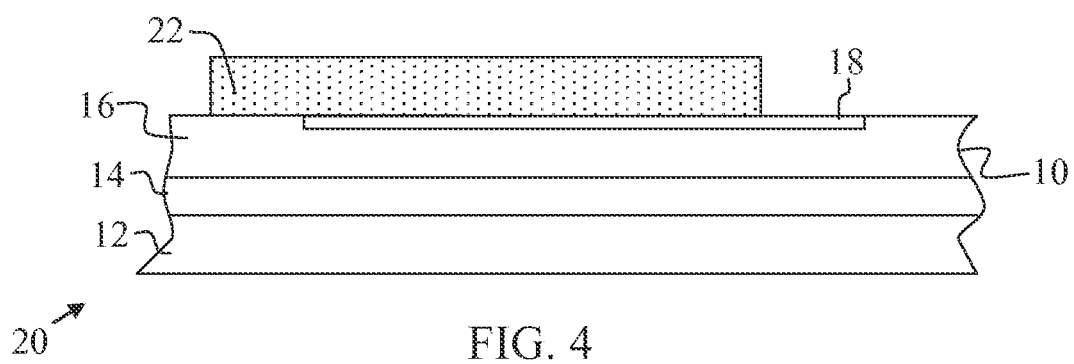
FIG. 4 is a cross-section view of the partially fabricated integrated circuit of FIG. 3, taken along line 4-4 in FIG. 3.
Figure 5:
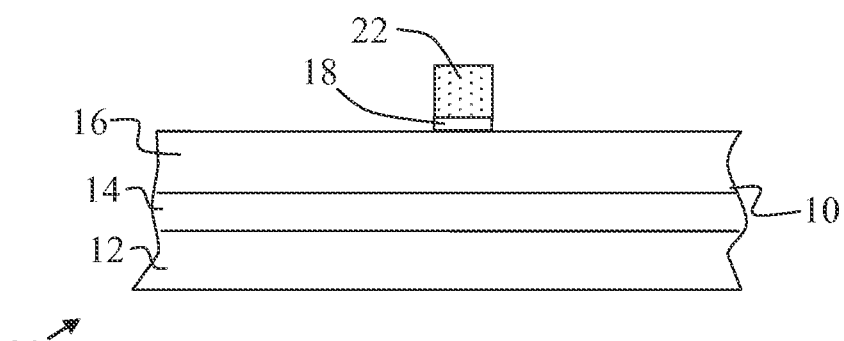
FIG. 5 is a cross-section view of the partially fabricated integrated circuit of FIG. 3, taken along line 5-5 in FIG. 3.

FIGS. 3-5 illustrate an exemplary integrated circuit 20 formed according to the methods described herein. As shown, the integrated circuit 20 includes a conductive gate structure 22 that is formed overlying the SOI structure 10 of FIGS. 1 and 2. FIG. 3 is a top view of the integrated circuit 20, FIG. 4 is a cross sectional view taken along line 4-4 in FIG. 3, and FIG. 5 is a cross sectional view taken along line 5-5 in FIG. 3.

In an exemplary embodiment the conductive gate structure 22 is formed by depositing a conductive gate material via LPCVD procedures. The exemplary conductive gate material is deposited to a thickness of from about 1000 to about 2000 Angstroms. The conductive gate material may be, for example, polysilicon or metal. If polysilicon, the conductive gate material layer can be doped in situ during deposition via the addition of arsine or phosphine to a silane or disilane ambient, or the polysilicon layer can be deposited intrinsically then doped via implantation of arsenic or phosphorous ions. Photolithographic and anisotropic RIE procedures, using $Cl_2$ as a selective etchant for polysilicon, may be used to define such a gate structure 22. Further, such a gate structure 22 can include a metal silicide layer such as tungsten silicide, or a composite featuring an overlying metal silicide component on an underlying polysilicon component.

As shown in FIG. 3, the exemplary gate structure 22 is formed with a "T" shape and has a laterally-extending component 23 and a longitudinally-extending component 24. The laterally-extending component 23 of the gate structure 22 is located over an active device region 26 where source/drain and channel regions will be formed. The laterally-extending component 23 of exemplary gate structure has a longitudinal width of from about 10 to about 350 nm. This width will subsequently define the channel length of the transistor device. The longitudinally-extending component 24 of the gate structure 22 bounds a body contact region 28 where a body contact will be formed in the upper semiconductor layer 16 of the SOI structure 10. The active device region 26 and body contact region 28 are adjacent, with the longitudinally-extending component 24 of the gate structure 22 positioned over their interface.

Figure 6:
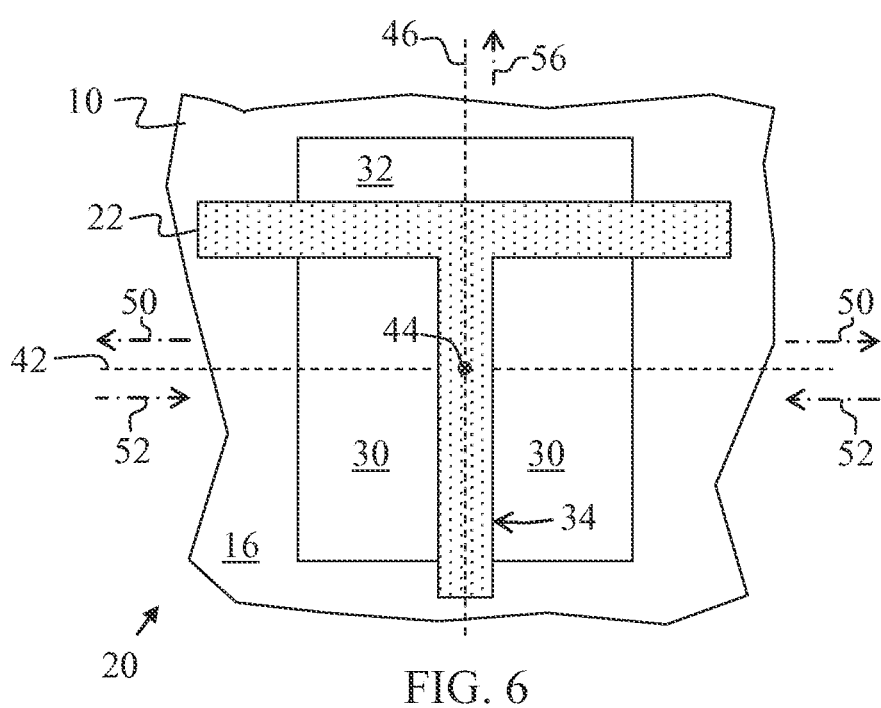
FIG. 6 is an overhead view of the partially fabricated integrated circuit of FIG. 3 after formation of body contact and source/drain regions in accordance with various embodiments herein, and illustrated the direction of stresses to be applied.

In FIG. 6, source/drain regions 30 and a body contact region 32 are formed on the SOI structure 10. The SOI structure 10 can be processed to form source/drain regions 30 and body contact regions 32 for N channel (NMOS) transistor devices and/or P channel (PMOS) transistor devices. For example, the processing described can be used to form NMOS transistor devices, PMOS transistor devices, or complementary metal oxide semiconductor (CMOS) devices comprised of both NMOS and PMOS transistors. The exemplary body contact region 32 and source/drain regions 30 are formed by ion implantation processes. For example, a photoresist block out shape, not shown in the drawings, may be patterned to protect a portion of a PMOS region (not shown in the drawings), from an N type ion implantation procedure used to form heavily doped N type source/drain regions 30 of an NMOS transistor device. Implantation of arsenic or phosphorous ions may be performed at an energy between about 5 to 40 KeV, at a dose between about 2E15 to 8E15 atoms/cm$^2$. The same N type ion implantation procedure may also be applied to the portion of a PMOS transistor device creating an N type body contact region 32 for the PMOS transistor device. After removal of the photoresist blockout shape via plasma oxygen ashing procedures, an anneal procedure is performed to activate the implanted N type ions, resulting in N type source/drain regions 30. In addition, a heavily doped N type region may also be formed in body contact region 32.

The identical process sequence may be employed for the formation of heavily doped P type source/drain regions 30 for the PMOS transistor device. That is, photoresist block out of the NMOS region allowing a P type ion implantation procedure to form a heavily doped P type heavily doped source/drain region 30 only in the PMOS region. An N type body contact region 32 may be formed in the PMOS region during the ion implantation procedure used to form the N type heavily doped source drain region 30 for the NMOS transistor device.

As shown in FIG. 6, a channel region 34 is defined between the source/drain regions 30 and lying under the gate structure 22. Further, the gate structure 22, source/drain regions 30, body contact region 32, and channel region 34 define a coordinate system having a longitudinal- or X-axis 42, a vertical- or Y-axis 44, and a lateral- or Z-axis 46. The embodiments described herein provide for selectively providing tensile longitudinal stress in the direction of arrows 50 for NMOS transistor devices, compressive longitudinal stress in the direction of arrows 52 for PMOS transistor devices, and tensile lateral stress in the direction of arrows 56 for both NMOS transistor devices and PMOS transistor devices. In other words, two different types of stress are applied longitudinally and laterally in PMOS transistor devices, while a same type of stress (tensile stress) is applied longitudinally and laterally in NMOS transistor devices.

Figure 7:
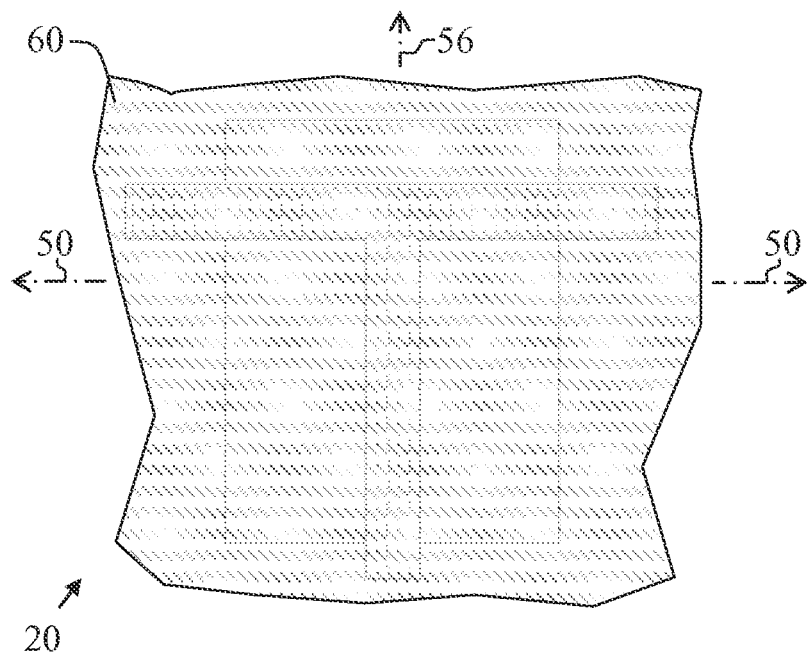
FIG. 7 is an overhead view of the partially fabricated integrated circuit of FIG. 6 after application of a stress layer in accordance with various embodiments herein.
Figure 8:
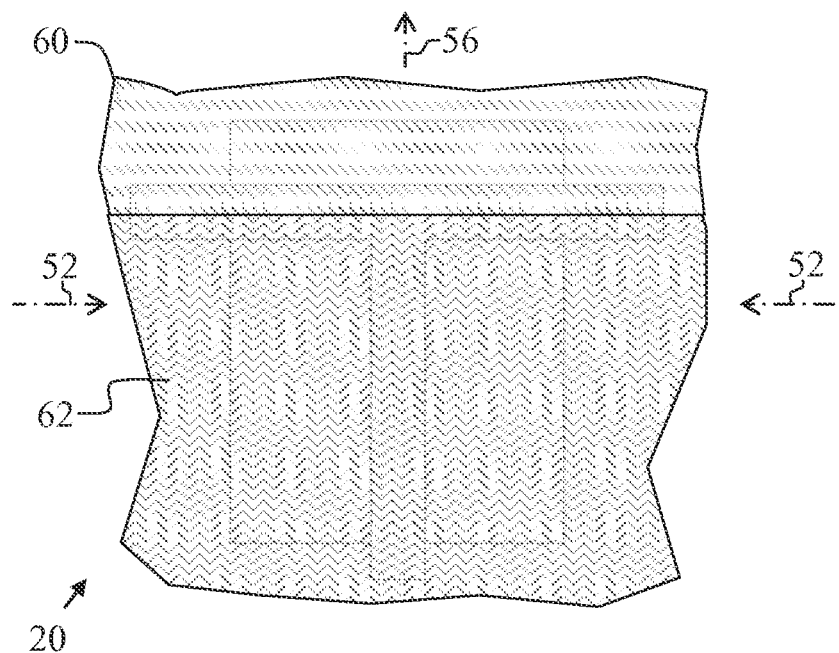
FIG. 8 is an overhead view of the partially fabricated integrated circuit of FIG. 6 after selective application of a two different stress layers in accordance with various embodiments herein.

FIGS. 7 and 8 illustrate the processing steps of an exemplary method for fabricating an integrated circuit with selectively stressed source/drain and channel regions and selectively stressed body contacts. FIG. 7 provides for stressing the source/drain and channel regions and body contacts of a NMOS transistor device. As shown, a tensile stress layer 60 is deposited over the integrated circuit 20 including an NMOS transistor device. Specifically, the tensile stress layer 60 is deposited over the gate structure, the source/drain regions, and the body contact. As a result, tensile longitudinal stress in the direction of arrows 50 is applied to the source/drain regions of the NMOS transistor device. Likewise, tensile lateral stress in the direction of arrows 56 is applied to the body contact of the NMOS transistor device. In an exemplary embodiment, the tensile stress layer 60 is silicon nitride.

In FIG. 8, the integrated circuit includes a PMOS transistor device. As shown, a tensile stress layer 60 is selectively formed over the body contact. Specifically, the tensile stress layer 60 is deposited on the body contact and on a portion of the gate structure adjacent the body contact. Further, a compressive stress layer 62 is selectively formed over the source/drain regions. Specifically, the compressive stress layer 62 is deposited on the source/drain regions and on the gate structure lying between the source/drain regions. In an exemplary embodiment, the compressive stress layer 62 is silicon nitride. As a result, tensile lateral stress in the direction of arrows 56 is applied to the body contact of the PMOS transistor device, while compressive longitudinal stress in the direction of arrows 52 is applied to the source/drain regions of the PMOS transistor device.

Selective formation of different stress layers 60 and 62 over components of integrated circuit 20 can be accomplished through a variety of suitable processes. In an exemplary embodiment, the formation of stress layers 60 and 62 includes the use of patterned masks to selectively deposit the layers 60 and 62 where desired. For example, a blocking mask may be deposited and patterned over the source/drain regions of PMOS devices, and a tensile stress layer 60 may be deposited over the body contacts of PMOS and NMOS devices and the source/drain regions of NMOS devices. Thereafter, the first blocking mask may be removed and a second blocking mask may be formed over the tensile stress layer 60, exposing the source/drain regions of PMOS devices. Then, a compressive stress layer 62 may be deposited to cover the source/drain regions of PMOS devices. The order of formation of layers 60 or 62 may be reversed such that the compressive stress layer 62 is formed before the tensile stress layer 60.

Other embodiments may deposit and etch a tensile stress layer 60 to cover the body contacts of PMOS and NMOS devices and the source/drain regions of NMOS devices, and deposit and etch a compressive stress layer 62 to cover the source/drain regions of PMOS devices. In such an embodiment, etching of the tensile stress layer 60 may form openings which are filled with the compressive stress layer 62. Alternatively, the compressive stress layer 62 may be deposited and etched first, with the compressive layer deposited around the compressive stress layer 62.

After formation of the stress layer or layers in FIG. 7 or FIG. 8, the stress applied by the stress layer or layers may be memorized in the device area and body contact area. For example, the partially fabricated integrated circuit may be annealed with a low thermal budget that is sufficient to create and transfer the stress of the stress layer or layers to the source/drain regions and body contact area. The stress layers may then be removed.

Thereafter, body contacts may be formed in body contact regions through typical contact formation processing. For example, in an exemplary embodiment, a metal is deposited over the upper semiconductor layer 16 in body contact regions and is annealed to react with the upper semiconductor layer to form silicide body contacts.

As processed herein, the channel regions and body contact areas are selectively stressed. Embodiments for selectively stressing the channel regions and body contact areas are described and include the selective application of a tensile stress liner to NMOS gate structures and/or source/drain regions, NMOS body contacts, and PMOS body contacts; and the selective application of a compressive stress liner to PMOS gate structures and/or source/drain regions. Additionally or alternatively, embedded tensile stress regions can be formed in NMOS source/drain regions, NMOS body contact areas, and PMOS body contact areas, while embedded compressive stress regions can be formed in PMOS source/drain regions.

In various embodiments, further processing of the partially completed integrated circuits 20 may include formation of additional contacts and interconnect structures (e.g., lines and vias, metal layers, and interlayer dielectric material). The processes described herein provide for formation of integrated circuits with selectively stressed body contacts. Further, the processes described herein provide for formation of integrated circuits with selectively longitudinally stressed channel and source/drain regions. The processes described herein provide for forming a PMOS transistor device having compressive stressed channel and source/drain regions and a tensile stressed body contact. Further, the processes described herein provide for selectively stressing body contacts without adding any additional steps to the fabrication process.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
   forming a channel region in a device area of a semiconductor-on-insulator (SOI) substrate;
   forming a body contact in a body contact area of a semiconductor-on-insulator (SOI) substrate, wherein the channel region and the body contact form a transistor device;
   forming a first stress film over the device area and selectively applying a first stress to the channel region in a longitudinal direction; and
   forming a second stress film over the body contact area and selectively applying a second stress to the body contact in a lateral direction perpendicular to the longitudinal direction.

2. The method of claim 1 wherein selectively applying a first stress to the channel region in a longitudinal direction comprises selectively applying a first stress to the channel region in a longitudinal direction perpendicular to the lateral direction after selectively applying a second stress to the body contact in the lateral direction.

3. The method of claim 1 wherein selectively applying a second stress to the body contact in a lateral direction perpendicular to the longitudinal direction comprises selectively applying a second stress opposite the first stress to the body contact in a lateral direction perpendicular to the longitudinal direction.

4. The method of claim 3 wherein:
   forming a channel region comprises forming a PMOS channel region and forming a body contact comprises forming a PMOS body contact;
   forming a first stress film over the device area and selectively applying a first stress to the channel region in a longitudinal direction comprises selectively applying a compressive stress to the PMOS channel region in a longitudinal direction; and
   forming a second stress film over the body contact area and selectively applying a second stress to the body contact in a lateral direction perpendicular to the longitudinal direction comprises selective applying a tensile stress to the PMOS body contact in a lateral direction.

5. The method of claim 1 wherein:
   selectively applying a first stress to the channel region in a longitudinal direction comprises selectively applying a compressive stress to the channel region in a longitudinal direction; and
   selectively applying a second stress to the body contact in a lateral direction perpendicular to the longitudinal direction comprises selectively applying a tensile stress to the body contact in a lateral direction perpendicular to the longitudinal direction.

6. The method of claim 5 wherein:
   forming a first stress film over the device area and selectively applying a compressive stress to the channel region in a longitudinal direction comprises depositing a compressive stress film over the device area; and
   forming a second stress film over the body contact area and selectively applying a tensile stress to the body contact in a lateral direction perpendicular to the longitudinal direction comprises depositing a tensile stress film over the body contact area.

7. The method of claim 6 wherein:
   selectively applying a compressive stress to the channel region in a longitudinal direction further comprises removing the compressive stress film from the device area; and
   selectively applying a tensile stress to the body contact in a lateral direction perpendicular to the longitudinal direction further comprises removing the tensile stress film from the body contact area before forming the body contact in the body contact area.

8. The method of claim 1 wherein forming a first stress film over the device area and selectively applying a first stress to the channel region in a longitudinal direction and forming a second stress film over the body contact area and selectively applying a second stress to the body contact in a lateral direction perpendicular to the longitudinal direction comprises:
   memorizing the first stress in the device area and the second stress in the body contact area; and
   removing the first stress film from the device area and removing the second stress film from the body contact area;
   wherein forming the channel region in the device area comprises forming the channel region in the device area after removing the first stress film; and
   wherein forming the body contact in the body contact area comprises forming the body contact in the body contact area after removing the second stress film.

9. The method of claim 1 wherein selectively applying a second stress to the body contact in a lateral direction perpendicular to the longitudinal direction comprises selectively applying a second stress to the body contact in a lateral direction perpendicular to the longitudinal direction, wherein the second stress is a same type as the first stress.

10. The method of claim 1 wherein selectively applying a second stress to the body contact in a lateral direction perpendicular to the longitudinal direction comprises selectively applying a second stress to the body contact in a lateral direction coplanar with the longitudinal direction and with a surface of the SOI substrate.

11. A method for fabricating an integrated circuit comprising:
providing a semiconductor substrate:
forming a first transistor device over the semiconductor substrate including a first channel region and a first body contact; and
forming a second transistor device over the semiconductor substrate including a second channel region and a second body contact;
stressing the first channel region, the first body contact, and the second body contact with a first-type stress; and
stressing the second channel region with a second-type stress.

12. The method of claim 11 wherein:
stressing the first channel region, the first body contact, and the second body contact with a first-type stress comprises stressing the first channel region in longitudinal direction, stressing the first body contact in a lateral direction, and stressing the second body contact in the lateral direction; and
stressing the second channel region with a second-type stress comprises stressing the second channel region in the longitudinal direction.

13. The method of claim 12 wherein stressing the first body contact and stressing the second body contact comprises stressing the first body contact and the second body contact in the lateral direction, wherein the lateral direction is coplanar with the longitudinal direction and with a surface of the semiconductor substrate.

14. The method of claim 11 wherein stressing the first channel region, the first body contact, and the second body contact with a first-type stress, and stressing the second channel region with a second-type stress comprises:
stressing a first device area, a first body contact area, and a second body contact area over the semiconductor substrate with the first-type stress; and
stressing a second device area with the second-type stress; wherein the first channel region is formed from the first device area, the first body contact is formed on the first body contact area, the second channel region is formed from the second device area, and the second body contact is formed on the second body contact area.

15. The method of claim 14 wherein:
stressing a first device area, a first body contact area, and a second body contact area over the semiconductor substrate with the first-type stress comprises stressing the first device area in a longitudinal direction and stressing the first body contact area and second body contact area in a lateral direction perpendicular to the longitudinal direction; and
stressing a second device area with the second-type stress comprises stressing the second device area in the longitudinal direction.

16. The method of claim 14 wherein:
stressing a first device area, a first body contact area, and a second body contact area over the semiconductor substrate with the first-type stress comprises:
depositing a first stress film over the first device area, the first body contact area, and the second body contact area;
memorizing the first-type stress in the first device area, the first body contact area, and the second body contact area; and
removing the first stress film; and
stressing a second device area with the second-type stress comprises:
depositing a second stress film over the second device area;
memorizing the second-type stress in the second device area; and
removing the second stress film.

17. The method of claim 11 wherein stressing the first channel region, the first body contact, and the second body contact with a first-type stress, and stressing the second channel region with a second-type stress comprises:
stressing an NMOS device area, a NMOS body contact area, and a PMOS body contact area over the semiconductor substrate with tensile stress; and
stressing a PMOS device area with compressive stress; wherein an NMOS channel region is formed from the NMOS device area, an NMOS body contact is formed on the NMOS body contact area, a PMOS channel region is formed from the PMOS device area, and a PMOS body contact is formed on the PMOS body contact area.

18. An integrated circuit comprising:
a semiconductor-on-insulator (SOI) substrate;
a PMOS transistor device formed over the SOI substrate and including:
a channel region under compressive stress; and
a body contact under tensile stress; and
an NMOS transistor device formed over the SOI substrate and including:
a channel region under tensile stress; and
a body contact under tensile stress.

19. The integrated circuit of claim 18 wherein:
the channel region of the PMOS transistor device is under compressive stress in a longitudinal direction;
the body contact of the PMOS transistor device is under tensile stress in a lateral direction perpendicular to the longitudinal direction;
the channel region of the NMOS transistor device is under tensile stress in the longitudinal direction; and
the body contact of the NMOS transistor device is under tensile stress in the lateral direction perpendicular to the longitudinal direction.

\* \* \* \* \*